US009969611B1

(12) United States Patent
Smith et al.

(10) Patent No.: US 9,969,611 B1
(45) Date of Patent: May 15, 2018

(54) STRUCTURE FOR CONTROLLING FLASHOVER IN MEMS DEVICES

(71) Applicant: Eagle Technology, LLC, Melbourne, FL (US)

(72) Inventors: Arlynn W. Smith, Blue Ridge, VA (US); Dan Chilcott, Buchanan, VA (US)

(73) Assignee: Eagle Technology, LLC, Melbourne, FL (US)

( * ) Notice: Subject to any disclaimer, the term of this patent is extended or adjusted under 35 U.S.C. 154(b) by 0 days. days.

(21) Appl. No.: 15/829,325

(22) Filed: Dec. 1, 2017

(51) Int. Cl.
*H01J 1/62* (2006.01)
*B81B 7/00* (2006.01)
*H01J 31/12* (2006.01)
*H01J 29/00* (2006.01)
*H01J 29/18* (2006.01)

(52) U.S. Cl.
CPC .......... *B81B 7/0064* (2013.01); *B81B 7/0038* (2013.01); *H01J 29/003* (2013.01); *H01J 31/12* (2013.01); *B81B 2201/047* (2013.01); *H01J 29/18* (2013.01); *H01J 2229/0046* (2013.01)

(58) Field of Classification Search
USPC ................................................ 313/497, 495
See application file for complete search history.

(56) References Cited

U.S. PATENT DOCUMENTS

| 4,639,385 | A | 1/1987 | Jolitz et al. |
| 5,726,529 | A | 3/1998 | Dean et al. |
| 6,169,358 | B1 | 1/2001 | Jones et al. |
| 6,249,083 | B1 | 6/2001 | Kim |
| 6,255,771 | B1 | 7/2001 | Jones et al. |
| 6,262,528 | B1 | 7/2001 | Kim |
| 6,837,766 | B2 | 1/2005 | Costello |
| 7,325,715 | B2 | 2/2008 | Costello |
| 9,524,960 | B2 | 12/2016 | Gogoi |
| 2004/0046245 | A1* | 3/2004 | Minervini ............. B81B 7/0064 257/704 |
| 2005/0214969 | A1* | 9/2005 | Gore .......................... B41J 2/16 438/106 |

(Continued)

OTHER PUBLICATIONS

Grzebyk, T., et al., "MEMS-Type Self-Packaged Field-Emission Electron Source," IEEE Transactions on Electron Devices, vol. 62(7):2339-2345 (Jul. 2015).

(Continued)

*Primary Examiner* — Vip Patel
(74) *Attorney, Agent, or Firm* — Edell, Shapiro & Finnan LLC

(57) ABSTRACT

An improved microelectromechanical device includes an upper plate, a lower plate, and a spacing structure. The upper plate includes a first surface and an opposite second surface. The lower plate is spaced from the upper plate. The lower plate includes a third surface that faces the first surface of the upper plate and a fourth surface that is opposite of the third surface. The lower plate also includes a series of structures disposed with the third surface of the lower plate. The spacing structure is coupled to the upper and lower plate. The spacing structure includes a base portion that is sealed to the first surface of the upper plate and the third surface of the lower plate. The spacing structure further includes a protrusion that extends from the base portion between the upper and lower plates.

20 Claims, 4 Drawing Sheets

(56) References Cited

U.S. PATENT DOCUMENTS

2008/0277672 A1* 11/2008 Hovey ................ B81C 1/00317
257/82

OTHER PUBLICATIONS

Miller, H.C., "Surface Flashover of Insulators," IEEE Transactions of Electrical Insulation, vol. 24(5):765-786 (1989).
Wetzer, J.M., "Vacuum Insulator Flashover: Mechanisms, Diagnostics and Design Implications," IEEE Transactions on Dielectrics and Electrical Insulation, vol. 4(4):349-357 (1997).

* cited by examiner

STRUCTURE FOR CONTROLLING FLASHOVER IN MEMS DEVICES

FIELD OF THE INVENTION

The present invention relates to high voltage microelectromechanical systems (MEMS). More specifically, the present invention relates to a MEMS image intensifier device with an added structure that mitigates the occurrence of flashover and multipacting in the device.

BACKGROUND

Microminiature field emitters may be used as electron sources in a variety of microelectronic or MEMS devices utilized in flat panel displays, automobiles, head wearable displays, heads up displays, outdoor signage, etc. One such use of a MEMS device is as an image intensifier for night vision goggles, which enables the reduction of the size and weight of the goggles.

The image intensifiers typically utilize high voltage (e.g., 4,000-6,000 volts) vacuum MEMS devices, which may be constructed from panels or plates of various materials that are spaced from one another. The space between the two plates may be evacuated and sealed by a spacing structure disposed along the outer or annular regions of each of the plates. One of the plates may serve as the cathode of the device, while the other plate may serve as the anode of the device. Thus, when a voltage is applied across the plates, the cathode plate accelerates electrons through the spacing toward the anode plate. The anode plate may include a phosphor screen that is impacted with electrons from the cathode, causing the phosphors of the screen to luminesce and emit light through the anode plate.

Because the type of MEMS devices utilized in image intensifiers requires a high voltage, and because these MEMS devices typically have cesium deposited in the vacuum, the surface path length (i.e., the path along the inner surface of the spacing structure between the cathode plate and the anode plate) must be 6-10 times the length of the vacuum gap (i.e., the spacing between the cathode plate and the anode plate). If the path length is not long enough, the MEMS device may run dark or leakage current, which can inhibit performance of the MEMS device.

In addition, typical high voltage MEMS devices such as image intensifiers are also subject to flashover at various surfaces. This can become catastrophic to the MEMS device, ultimately resulting in failure or destruction of the MEMS device. For example, electrons that are created at the triple junction of the MEMS device (e.g., the intersection of the upper plate, the spacing structure, and the vacuum) can be accelerated by the field strength in the vacuum gap to strike a vertical surface of the spacing structure. The impact of electrons on the vertical surfaces of the spacing structure creates a cascading process of electrons, which results in multipacting, and can catastrophically destroy the device. Furthermore, electrons that backscatter from the phosphor screen of the anode plate may also impact the vertical surface of the spacing structure to also cause multipacting.

Therefore, what is needed is a MEMS device with a spacing structure that increases the surface path length between the cathode plate and the anode plate, while minimizing the vacuum gap between the cathode plate and anode plate. Furthermore, what is also needed is a spacing structure of a MEMS device that minimizes or eliminates the occurrences of multipacting from electrons formed at the triple junction of the MEMS device. What is also needed is a spacing structure of a MEMS device that reduces the likelihood that electron backscatter from a phosphor screen or anode surface results in multipacting.

SUMMARY

An improved microelectromechanical device includes an upper plate, a lower plate, and a spacing structure. The upper plate includes a first surface and an opposite second surface. The lower plate may be spaced from the upper plate. The lower plate includes a third surface that faces the first surface of the upper plate and a fourth surface that is opposite of the third surface. The lower plate also includes a series of structures disposed with the third surface of the lower plate. The spacing structure is coupled to the upper and lower plate, and includes a base portion that is sealed to the first surface of the upper plate and the third surface of the lower plate. The spacing structure further includes a protrusion portion that extends from the base portion between the upper and lower plates. The series of structures may be disposed in the third surface of the spacing structure below the protruding portion. The first surface of the upper plate and the third surface of the lower plate are spaced apart by first length (i.e., the thickness of the space between the upper plate and the lower plate. The base portion, the protruding portion, and the series of structures collectively form a continuous second length that is at least six times longer than the first length in order to minimize dark or leakage current.

Another embodiment of an improved microelectromechanical device also includes an upper plate, a lower plate, and a spacing structure. The upper plate includes a first surface and an opposite second surface. The lower plate is spaced from the upper plate and includes a third surface that faces the first surface of the upper plate and a fourth surface that is opposite of the third surface. The spacing structure is coupled to the upper and lower plate. The spacing structure includes a base portion that is sealed to the first surface of the upper plate and the third surface of the lower plate. The spacing structure further includes a protrusion portion that extends from the base portion between the upper and lower plates. Furthermore, a series of structures may be disposed on the protruding portion such that the series of structures extend downwardly toward the third surface of the lower plate. The first surface of the upper plate and the third surface of the lower plate are spaced apart by first length. The base portion, the protruding portion, and the series of structures collectively form a continuous second length that is at least six times longer than the first length in order to minimize dark or leakage current.

DETAILED DESCRIPTION

Figure 1:
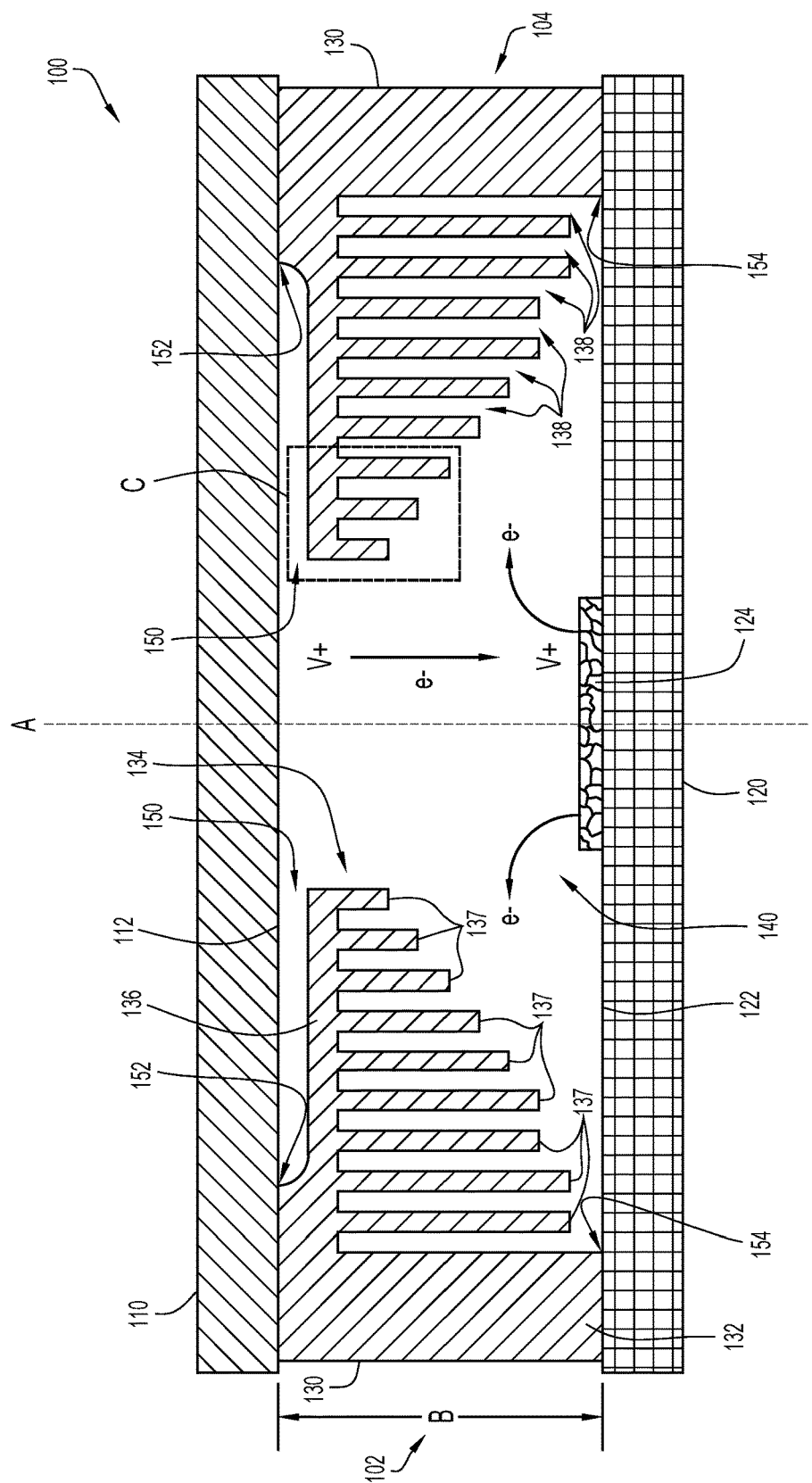
FIG. 1 illustrates a cross-sectional view of a first example embodiment of an high voltage MEMS device with increased surface path length in accordance with the present invention.

Exemplary embodiments of a MEMS device utilized in image intensifiers of night vision goggles in accordance with the present invention are illustrated in FIGS. 1-4. The present invention embodiments disclosed herein eliminate dark current and leakage current of the MEMS device. Furthermore, the first embodiment of the MEMS device 100, as illustrated in FIG. 1, also eliminates or minimizes the occurrence of multipacting. MEMS device 100 includes an upper plate 110, a lower plate 120, and a spacing structure 130. The upper and lower plates 110, 120 may both be semiconductor wafers, where the upper plate 110 serves as the cathode plate of the MEMS device 100, and the lower plate 120 serves as the anode plate of MEMS device 100. The space 140 disposed between the upper plate 110, lower plate 120, and spacing structure 130 may be a vacuum with cesium disposed within the vacuum space 140. The spacing structure 130 may be constructed from an insulative dielectric material that forms a seal with both the upper and lower plates 110, 120, and enables the formation of the vacuum space 140. The spacing structure 130 may separate the inner surface 112 of the upper plate 110 from the inner surface 122 of the lower plate 120 by a vacuum gap B. Furthermore, the MEMS device 100 may be formed in any shape, including, but not limited to, rectangular, circular, triangular, etc. Regardless of the shape of the MEMS device 100, the spacing structure 130 is annularly sealed to the inner surface 112 of the upper plate 110 and the inner surface 122 of the lower plate 120.

While not illustrated, the upper plate 110 may include any number of additional structures of various sizes and shapes that are useful for emitting/accelerating electrons toward the lower plate 120 when a voltage is applied across the MEMS device 100 and the upper and lower plates 110, 120. Furthermore, the lower plate 120 may include a phosphor screen 124 centrally disposed on the inner surface 122 of the lower plate 120. Electrons that travel from the upper plate 110 to the lower plate 120 may strike the phosphor screen 124, causing the phosphors to luminesce and emit light that can be utilized in a display.

As illustrated in FIG. 1, the MEMS device includes a midplane A that centrally extends through the upper and lower plates 110, 120 between the first and second sides 102, 104 of the cross-section of the MEMS device 100. As previously explained, the spacing structure 130 is coupled or sealed annularly to the upper and lower plates 110, 120. The spacing structure 130, moreover, is formed continuously around the annular regions of the MEMS device 100. Thus, the portion of the spacing structure 130 proximate to the first side 102 of the illustrated cross-section of the MEMS device 100 in FIG. 1 is formed uniformly with the portion of the spacing structure 130 disposed proximate to the second side 104 of the illustrated cross-section of the MEMS device 100. As illustrated, the spacing structure 130 includes a base portion 132 and a protruding portion 134. The base portion 132 is disposed proximate to the annular sides 102, 104 of the MEMS device 100 and is coupled to the inner surfaces 112, 122 of the upper and lower plates 110, 120, respectively. The protruding portion 134 of the spacing structure 130 extends into the vacuum space 140 from the base portion 132 towards the midplane A. For the embodiment illustrated in FIG. 1, the protruding portion 134 includes extension arm 136 that extends towards the midplane A, and a series of downwardly extending members or fins 137 that are spaced apart from one another by a series of trenches or troughs 138. As illustrated, the fins 137 extend downwardly from extension arm 136 towards the inner surface 122 of the lower plate 120. The fins 137 that are disposed closest to the midplane A are shorter in length than the fins 137 that are disposed closer to base portion 132. In other words, the lengths of the fins 137 taper or decrease the closer the fins 137 are disposed on the extension arm 136 to the midplane A.

As further illustrated in FIG. 1, the extension arm 136 of the protruding portion 134 of the spacing structure 130 collectively forms a channel 150 with the inner surface 112 of the upper plate 110. Furthermore, the channel 150 is disposed in proximity to the upper triple junctions 152 of MEMS device 100. In other words, an upper triple junction 152, which is formed by the conjunction or intersection of the upper plate 110, the spacing structure 130, and the vacuum space 140, is formed at the end of the channel 150 that is disposed proximate to the base portion 132 of the spacing structure 130. Lower triple junctions 154 are disposed proximate to the lower plate 120, where a lower triple junction 154 is formed by the conjunction or intersection of the lower plate 120, the spacing structure 130, and the vacuum space 140.

The illustrated shape of the spacing structure 130 achieves several purposes that improves performance of the MEMS device 100. First, as illustrated and previously described, an upper triple junction 152 of the MEMS device 100 is located at the end of channel 150. By orienting the upper triple junction 152 within the channel 150, which has a horizontal surface that extends towards the midplane A of the MEMS device 100, the ability of electrons formed at the upper triple junction 152 to cause a multipacting event is eliminated. By positioning the vertical surfaces of the spacing structure beyond the end of the channel 150, electrons formed at the upper triple junction 152 are unable to impact a vertical surface of the spacing structure 130 because the field strength at the upper triple junction 152 is not typically strong enough to scatter electrons beyond the end of the channel 150. Thus, electrons formed at the upper triple junction 152 would not likely cause multipacting in the MEMS device 100.

The channel 150 also serves an additional purpose. As previously explained, when formulating the MEMS device 100, the vacuum space 140 between the upper and lower plates 110, 120 is evacuated. Once the spacing structure 130 is sealed to the inner surfaces 112, 122 of the upper and lower plates 110, 120, the vacuum space 140 can be evacuated of air and/or gas, and sealed off from the outside atmosphere. The channel 150 provides for the placement of a getter (not shown). The getter is a deposit of reactive material that is placed inside the vacuum space 140 for the purpose of completing and maintaining the vacuum. The getter may absorb gas molecules that come in contact with it as a result of the outgassing from materials within the vacuum space 140. This further prevents the ionization of gas molecules as a result of being impacted with electrons, which would cause the creation of flashovers/multipacting in the MEMS device 100.

Figure 2:
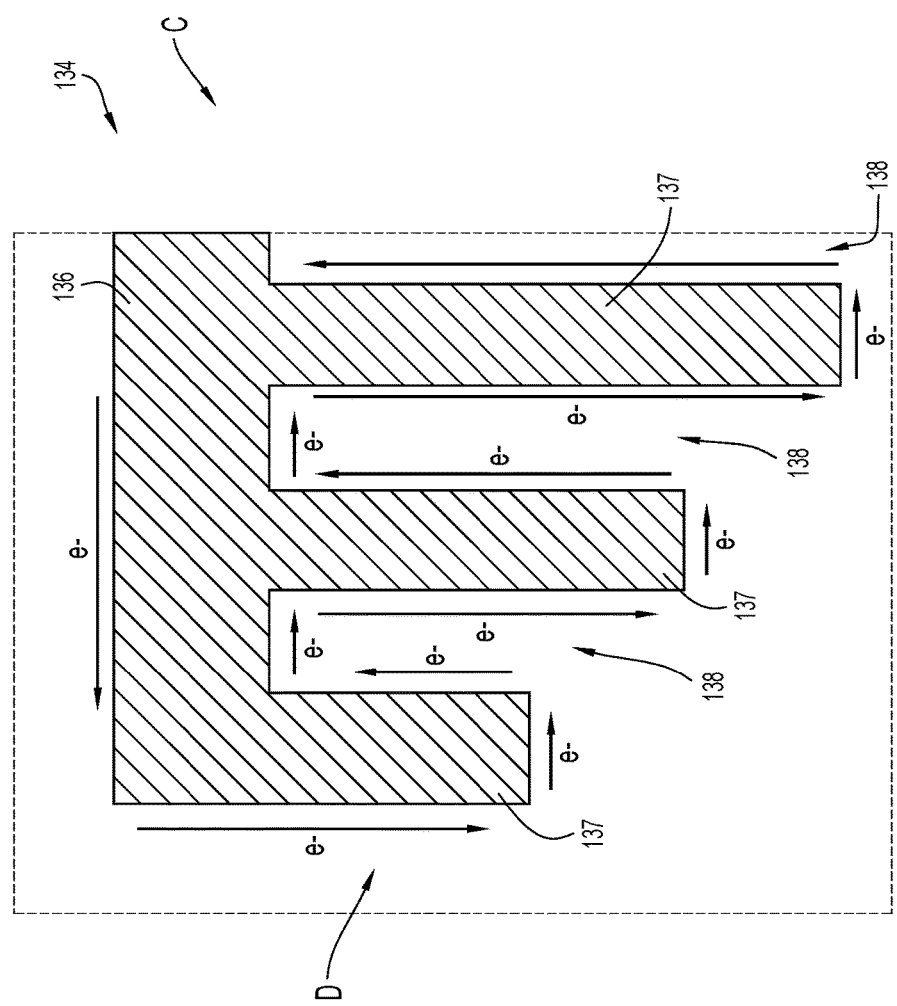
FIG. 2 illustrates a detailed view of a portion of a dielectric structure of the high voltage MEMS device illustrated in FIG. 1.

The illustrated shape of the spacing structure 130 also increases the surface path length along the spacing structure 130 between the upper plate 110 and the lower plate 120. FIG. 2, which is a detailed view of the end of the protruding portion 134 of the spacing structure 130 that is disposed within the bounding box C illustrated in FIG. 1, illustrates a portion of the surface path length D. Electrons traveling along the surface of the spacing structure 130 from the upper plate 110 to the lower plate 120 may travel along surface path D. As illustrated, the electrons follow the surface of the spacing structure 130 by traveling along top surface of the extension arm 136 of the protruding portion 134, down and up each of the fins 137, and into and out of each of the trenches 138 of the spacing structure 130. This causes the surface path length D to be longer than the vacuum gap B. In order to limit the amount of dark or leakage current, the spacing structure 130 may have a surface path length D that is 6 to 10 times longer than the vacuum gap B. The formation of the spacing structure 130 enables the vacuum gap B of a MEMS device 100 to be reduced while minimizing the lateral dimensions of the MEMS device 100.

In addition, the tapering or reduction of the length of the fins 137 along the extension arm 136 of the protruding portion 134 of the spacing structure 130 minimizes the ability of electrons that impact the phosphor screen 124 and back scatter through the vacuum space 140 to cause multipacting. If electrons that are accelerated from the upper plate 110 to the lower plate 120 and impact the phosphor screen 124 are not trapped by the phosphor screen 124, the electrons may be bounced upward and outward, as illustrated in FIG. 1. The tapering of the lengths of the fins 137 along the extension arm 136 reduces the possibility of the back scattered electrons from impacting the vertical surfaces of the spacing structure (i.e., the vertical surfaces of the fins 137), and, instead, increases the possibility that the back scatted electrons impact a horizontal surface (i.e., the inner surface 122 of the lower plate 120). Thus, by reducing the possibility of back scattered electrons from impacting vertical surfaces within the vacuum space 140, the possibility of multipacting is also reduced.

Figure 3:
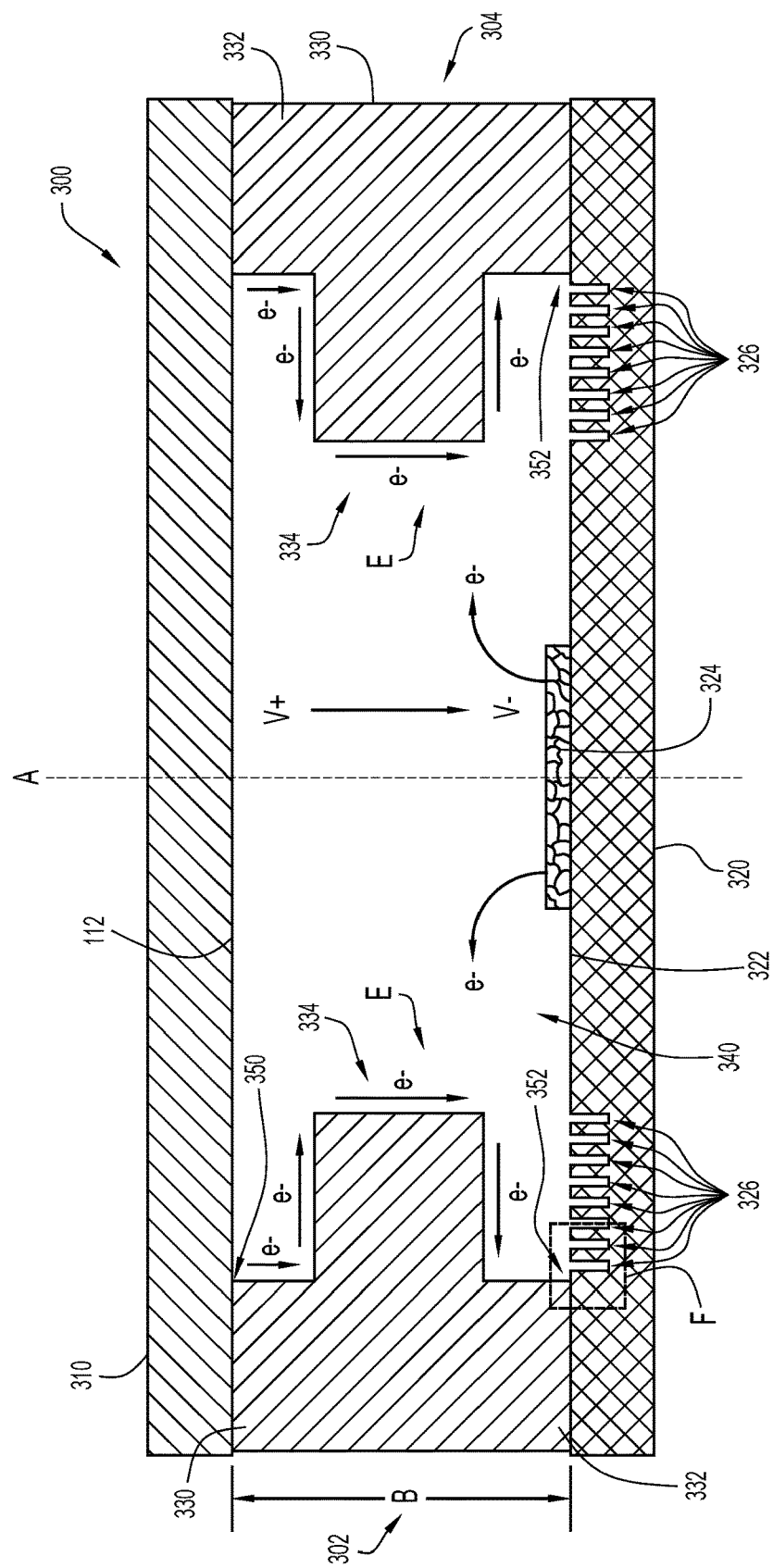
FIG. 3 illustrates a cross-sectional view of a second example embodiment of an high voltage MEMS device with increased surface path length in accordance with the present invention.
Figure 4:
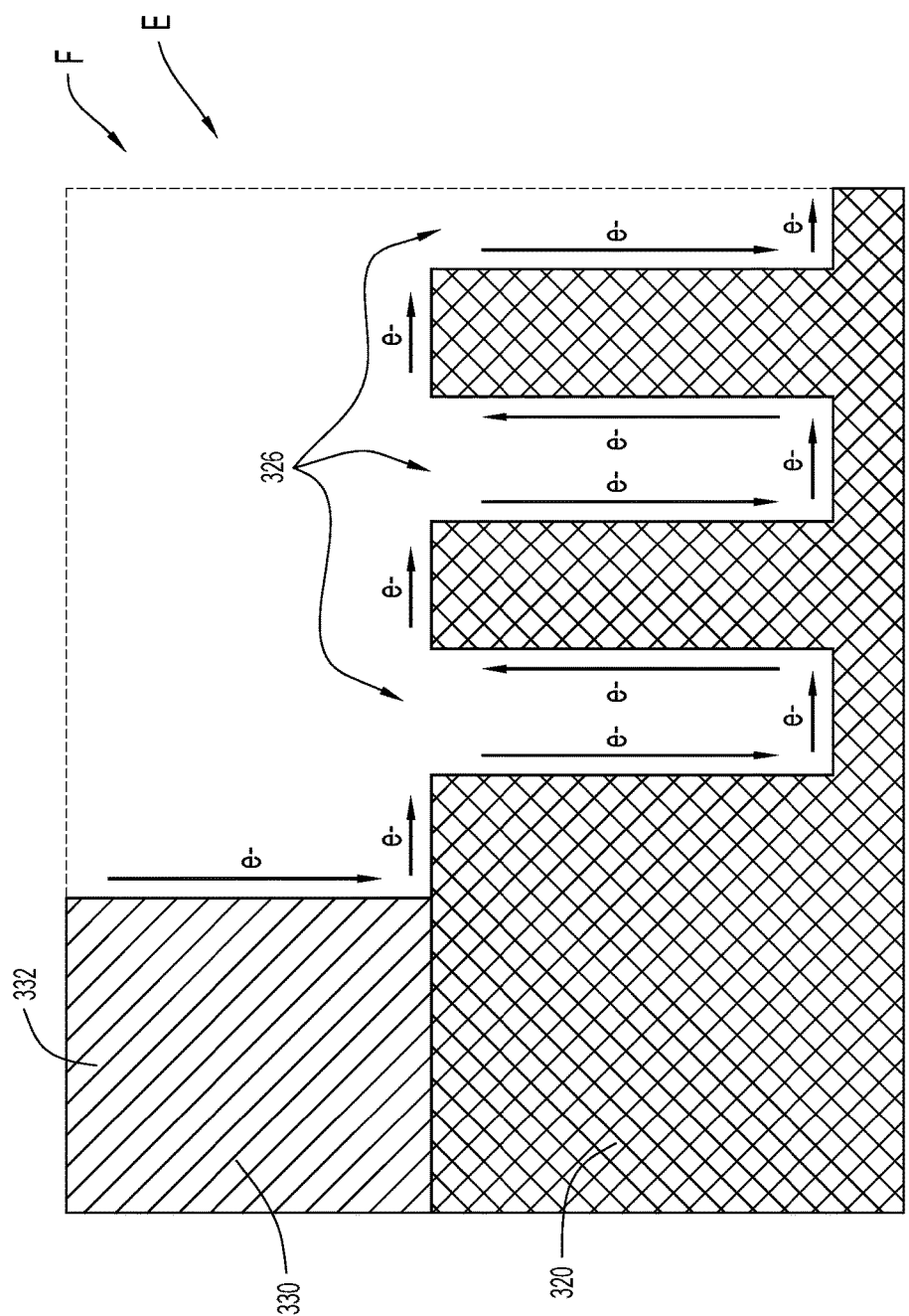
FIG. 4 illustrates a detailed view of a portion of the lower plate of the high voltage MEMS device illustrated in FIG. 3.

Turning to FIGS. 3 and 4, illustrated is a second embodiment of MEMS device 300, which, similar to the first embodiment 100, eliminates dark current and leakage current of the MEMS device. The second embodiment of the MEMS device 300, however, may not eliminate or minimize the occurrence of multipacting like that of the first embodiment of the MEMS device 100. Similar to the first embodiment 100, the second embodiment of MEMS device 300 includes an upper plate 310, a lower plate 320, and a spacing structure 330. The upper and lower plates 310, 320 may both be semiconductor wafers, where the upper plate 310 serves as the cathode plate of the MEMS device 300, and the lower plate 320 serves as the anode plate of the MEMS device 300. Similar to the first embodiment 100, the space 340 disposed between the upper plate 310, lower plate 320, and spacing structure 330 may be a vacuum with caesium disposed within the vacuum space 340. Furthermore, the spacing structure 330 may be constructed from an insulative dielectric material that forms a seal with both the upper and lower plates 310, 320 and enables the formation of the vacuum space 340. The spacing structure 330 may separate the inner surface 312 of the upper plate 310 from the inner surface 322 of the lower plate 320 by a vacuum gap B. Similar to the first embodiment 100, the second embodiment of the MEMS device 300 may be formed in any shape, including, but not limited to, rectangular, circular, triangular, etc. Regardless of the shape of the MEMS device 300, the spacing structure 330 is annularly sealed to the inner surface 312 of the upper plate 310 and the inner surface 322 of the lower plate 320.

While not illustrated, the upper plate 310 may include any number of additional structures of various sizes and shapes that are useful for emitting electrons at the direction of the lower plate 320 when a voltage is applied across the MEMS device 300 and the lower and upper plates 310, 320. Furthermore, the lower plate 320 may include a phosphorus screen 324 centrally disposed on the inner surface 322 of the lower plate 320. Electrons accelerated from the upper plate 310 toward the lower plate 320 may strike the phosphor screen 324 to cause the phosphors to luminesce and emit light that can be utilized in a display.

As illustrated in FIG. 3, and similar to the first embodiment 100, the MEMS device 300 includes a midplane A that centrally extends through the upper and lower plates 310, 320 between the first and second sides 302, 304 of the cross-section of MEMS device 300. As previously explained, the spacing structure 330 is coupled or sealed annularly to the upper and lower plates 310, 320. The spacing structure 330, moreover, is formed continuously around the annular regions of the MEMS device 300. Thus, the portion of the spacing structure 330 proximate to the first side 302 of the illustrated cross-section of MEMS device 300 in FIG. 3 is formed uniformly with the portion of the spacing structure 330 disposed proximate to the second side 304 of the cross-section of MEMS device 300. As illustrated, the spacing structure 330 includes a base portion 332 and a protruding portion 334. The base portion 332 is disposed proximate to the annular sides 302, 304 of the MEMS device 300 and is coupled to the inner surfaces 312, 322 of the upper and lower plates 310, 320, respectively. The protruding portion 334 of the spacing structure 330 extends into the vacuum space 340 from the base portion 332 towards the midplane A. Unlike the first embodiment 100, the second embodiment of MEMS device 300 does not include a series fins spaced apart from one another by a series of trenches or troughs. Furthermore, the protruding portion 334 is spaced from both the inner surface 312 of the upper plate 310 and the inner surface 322 of the lower plate 320.

As further illustrated in FIG. 3, the inner surface 322 of the lower plate 320 includes a series of trenches 326. The series of trenches 326 are disposed within the inner surface 322 of the lower plate 320 such that the trenches 326 are disposed under the protruding portions 334 of the spacing structure 330. Thus, the lower plate 320 includes a series of trenches 326 proximate to the portion of the spacing structure 330 disposed on the first side 302 of the MEMS device 300 and a series of trenches 326 proximate to the portion of the spacing structure 330 disposed on the second side 304 of the MEMS device 300. The series of trenches 326 may be formed in the inner surface 322 of the lower plate 320 through any one of the methods including, but not limited to, deep reactive-ion etching (DRIE) etching, wafer bonding, undercutting of sacrificial films, isotropic etching, anisotropic etching, etc. In this second embodiment, the lower plate 320 may be formed from silicon with an oxide disposed on the walls of the trenches 326. The lower plate 320 may further be formed to include an insulator disposed on the inner surface 322, and the series of trenches 326 being formed directly in the insulator. In this embodiment, the anode region would have a conductor disposed within it.

Similar to the first embodiment 100, the second embodiment of the MEMS device 300 contains upper triple junctions 350 and lower triple junctions 352. An upper triple junction 350 is disposed proximate to the upper plate 310 and is formed by the conjunction or intersection of the upper plate 310, the spacing structure 330, and the vacuum space 340. Conversely, a lower triple junction 352 is disposed proximate to the lower plate 320 and is formed by the conjunction or intersection of the lower plate 320, spacing structure 330, and the vacuum space 340. Unlike the first embodiment 100, the upper triple junctions 350 of the second embodiment of MEMS device 300 is not disposed within a narrow channel, and thus, electrons formed at the upper triple junctions 350 may be accelerated by the field strength onto the vertical surfaces of the spacing structure 340, which could result in multipacting.

As illustrated in FIGS. 3 and 4, the combination of the protruding portion 334 and the series of trenches 326 increases the surface path length E of the second embodiment of the MEMS device 300. As best illustrated in FIG. 3, a portion of the surface path length E is formed by the vertical surface of the base portion 332 and the surfaces of the protruding portion 334. Electrons may travel along these surfaces of the spacing structure 330 from the upper plate 310 to the lower plate 320 by traveling down the inner surface of the base portion and around the protruding portion 334 of the spacing structures 330. The surface path E also spans into and out of the series of trenches 326 disposed in the inner surface 322 of the lower plate 320, as illustrated in FIG. 4, which is a detailed view of the portion of the MEMS device 300 within bounding box F illustrated in FIG. 3. Thus, for the second embodiment of MEMS device 300, the surface path length E follows the inner surface of the spacing structure 330 and the trenches 326 of the inner surface 322 of the lower plate 320. As previously explained, in order to limit the amount of dark or leakage current, the spacing structure 330 may have a surface path length E that is 6 to 10 times longer than that of vacuum gap B. The formation of the spacing structure 330 plus the number and depth of trenches 326 enables the vacuum gap B of a MEMS device 300 to be reduced while minimizing the lateral dimensions of the MEMS device 300.

It is to be understood that terms such as "left," "right," "top," "bottom," "front," "rear," "side," "height," "length," "width," "upper," "lower," "interior," "exterior," "inner," "outer" and the like as may be used herein, merely describe points or portions of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment of the invention.

Although the disclosed inventions are illustrated and described herein as embodied in one or more specific examples, it is nevertheless not intended to be limited to the details shown, since various modifications and structural changes may be made therein without departing from the scope of the inventions and within the scope and range of equivalents of the claims. In addition, various features from one of the embodiments may be incorporated into another of the embodiments. Accordingly, it is appropriate that the appended claims be construed broadly and in a manner consistent with the scope of the disclosure as set forth in the following claims.

What is claimed:

1. A microelectromechanical device, comprising:
   an upper plate with a first surface and opposite second surface;
   a lower plate spaced from the upper plate, the lower plate comprising:
   a third surface facing the first surface of the upper plate,
   a fourth surface opposite of the third surface, and
   a series of trenches disposed within the third surface; and
   a spacing structure sealed annularly to the first surface of the upper plate and the third surface of the lower plate such that the upper plate, the lower plate, and the spacing structure define a space, the spacing structure having a base portion extending between the upper plate and the lower plate and a protruding portion that extends inwardly from the base portion into the space.

2. The microelectromechanical device of claim 1, wherein a dielectric material covers the series of trenches and the spacing structure.

3. The microelectromechanical device of claim 1, wherein the space is a vacuum.

4. The microelectromechanical device of claim 1, wherein the protruding portion is spaced from the upper plate and the lower plate.

5. The microelectromechanical device of claim 4, wherein the series of trenches are disposed under the protruding portion of the spacing structure.

6. The microelectromechanical device of claim 1, wherein the first surface of the upper plate and the third surface of the lower plate are spaced apart a first length, and wherein the spacing structure, the protruding portion, and the series of trenches collectively form a continuous inner surface having a second length, the second length being at least six times larger than the first length.

7. The microelectromechanical device of claim 1, wherein the protruding portion of the spacing structure may include a series of fins extending downwardly from the protruding portion.

8. The microelectromechanical device of claim 7, wherein the fins taper in length along the protruding portion such that the fins disposed proximate to the base portion are longer in length than the fins disposed proximate a free end of the protruding portion that extends into the space.

9. The microelectromechanical device of claim 1, wherein a phosphor screen is disposed on the third surface of the lower plate.

10. The microelectromechanical device of claim 1, wherein the upper plate is a cathode and the lower plate is an anode.

11. A microelectromechanical device comprising:
    an upper plate with a first surface and opposite second surface;
    a lower plate spaced from the upper plate, the lower plate including a third surface facing the first surface of the upper plate, and a fourth surface opposite of the third surface; and
    a spacing structure coupled to the upper plate and the lower plate, the spacing structure comprising:
    a base portion sealed to the first surface of the upper plate and the third surface of the lower plate,
    a protruding portion extending from the base portion between the upper plate and the lower plate,
    a series of fins extending downwardly from the protruding portion, and
    a series of trenches disposed between each of the fins.

12. The microelectromechanical device of claim 11, wherein the spacing structure is sealed annularly to the upper and lower plates such that the upper plate, the lower plate, and the spacing structure collectively define a space that is evacuated.

13. The microelectromechanical device of claim 12, wherein the protruding portion includes a free end that extends into the space.

14. The microelectromechanical device of claim 13, wherein the fins taper in length along the protruding portion such that the fins disposed proximate to the base portion are longer in length than the fins disposed proximate the free end of the protruding portion.

15. The microelectromechanical device of claim 11, wherein the protruding portion collectively forms a channel with the first surface of the upper plate, an upper triple junction being disposed within the channel.

16. The microelectromechanical device of claim 11, wherein the first surface of the upper plate and the third surface of the lower plate are spaced apart by first length, and the base portion, the protruding portion, the series of fins, and the series of trenches collectively form a continuous inner surface having a second length that is at least six times longer than the first length.

17. A microelectromechanical device comprising:
 an upper plate with a first surface and opposite second surface;
 a lower plate spaced from the upper plate, the lower plate including a third surface facing the first surface of the upper plate, and a fourth surface opposite of the third surface; and
 a spacing structure coupled to the upper plate and the lower plate, the spacing structure comprising:
  a base portion sealed to the first surface of the upper plate and the third surface of the lower plate, and
  a protruding portion extending from the base portion between the upper plate and the lower plate.

18. The microelectromechanical device of claim 17, wherein a series of structures are disposed within the third surface of the lower plate such that the series of structures are disposed under the protruding portion of the spacing structure.

19. The microelectromechanical device of claim 18, wherein the first surface of the upper plate and the third surface of the lower plate are spaced apart by first length, and the base portion, the protruding portion, and the series of structures collectively form a second length that is at least six times longer than the first length.

20. The microelectromechanical device of claim 18, wherein a dielectric material covers the series of structures.

* * * * *